United States Patent [19]
Yamamoto et al.

[11] Patent Number: 5,964,951
[45] Date of Patent: Oct. 12, 1999

[54] RINSING SOLUTION

[75] Inventors: Kenji Yamamoto; Akihiko Igawa, both of Shizuoka, Japan

[73] Assignee: Clariant International Ltd., Muttenz, Switzerland

[21] Appl. No.: 08/996,510

[22] Filed: Dec. 23, 1997

[30] Foreign Application Priority Data

Dec. 26, 1996 [JP] Japan .................................. 8-347576

[51] Int. Cl.$^6$ .................. B08B 3/08; G03F 7/30
[52] U.S. Cl. .................. 134/1.2; 134/1.1; 134/1.3; 430/302; 430/319
[58] Field of Search .............................. 134/1.1, 1.2, 1.3, 134/25.4, 38, 42; 430/302, 319

[56] References Cited

U.S. PATENT DOCUMENTS

| | | | |
|---|---|---|---|
| 2,751,373 | 6/1956 | Unruth et al. ........................... | 260/78.5 |
| 2,811,509 | 10/1957 | Smith et al. ................................ | 260/63 |
| 3,763,086 | 10/1973 | Kalopissis et al. .................... | 260/41 C |
| 3,854,946 | 12/1974 | Sayigh et al. ............................ | 96/35.1 |
| 3,980,587 | 9/1976 | Sullivan ..................................... | 134/38 |
| 4,416,976 | 11/1983 | Shell .......................................... | 430/331 |
| 4,550,069 | 10/1985 | Pampalone ............................... | 430/165 |
| 4,592,787 | 6/1986 | Johnson ..................................... | 134/38 |
| 4,609,614 | 9/1986 | Pampalone et al. ..................... | 430/323 |
| 4,765,844 | 8/1988 | Merrem et al. ........................... | 134/38 |
| 4,786,580 | 11/1988 | Hsieh et al. ............................. | 430/325 |
| 4,822,723 | 4/1989 | Dhillon .................................... | 430/331 |
| 4,910,122 | 3/1990 | Arnold et al. ........................... | 430/313 |
| 4,983,490 | 1/1991 | Durham .................................... | 430/169 |
| 5,039,594 | 8/1991 | Durham .................................... | 430/326 |
| 5,066,561 | 11/1991 | Pampalone ............................... | 430/169 |
| 5,294,680 | 3/1994 | Knors et al. ............................. | 525/327 |
| 5,529,887 | 6/1996 | Horn et al. ................................ | 134/38 |

FOREIGN PATENT DOCUMENTS

89/06378  7/1989  WIPO.

OTHER PUBLICATIONS

Patent Abstracts of Japan, vol. 014, No. 084 (P–1007), Feb. 16, 1990, JP 01296246A (Dainippon Printing Co. Ltd.), Nov. 29, 1989, abstract.
Patent Abstracts of Japan, 43 E 1561, JP 06–69120 (Mitsubishi Electric Corp.), Aug. 20, 92, abstract.
Patent Abstracts of Japan, JP 07131096 (Toshiba Corp Denki Kogyo Co. Ltd.), May 19, 95, abstract.
Patent Abstracts of Japan, 161 P 1777, JP06–118656 (Japan Synthetic Rubber Co. Ltd.), Oct. 5, 92, abstract.
Patent Abstracts of Japan, 25 P 1792, JP 06–148896 (Tokyo Ohka Kogyo Co. Ltd.), Nov. 13, 92, abstract.
Patent Abstracts of Japan, JP 08–129056 (Ando Electric Co. Ltd.), May 21, 96, abstract.

*Primary Examiner*—Hoa Van Le
*Attorney, Agent, or Firm*—Andrew F. Sayko, Jr.; Scott E. Hanf

[57] ABSTRACT

A rinsing solution for lithography which comprises a homogeneous solution of a water-soluble organic solvent and water. The water-soluble organic solvent may be any water-miscible organic solvent that have been used as solvents or rinsing solutions for resists or anti-reflective coatings. Preferred examples of the water-soluble organic solvent are a mixture of propylene glycol monoethyl ether and propylene glycol monomethyl ether acetate, a mixture of propylene glycol monomethyl ether and propylene glycol monomethyl ether acetate, and ethyl lactate. This rinsing solution is useful for dissolving away or stripping away cured or non-cured unnecessary resists, anti-reflective coatings, etc. from substrates such as in integrated circuit elements, color filters, liquid crystal display elements, etc. or from a resist-applying apparatus.

5 Claims, No Drawings

RINSING SOLUTION

BACKGROUND OF THE INVENTION

This invention relates to a rinsing solution for lithography and, more particularly, to a rinsing solution for lithography which is useful for dissolving away or stripping away cured or non-cured unnecessary resists, anti-reflective coatings, etc. from substrates such as in integrated circuit elements, color filters, liquid crystal display elements, etc. or from a resist-applying apparatus.

Lithographic technique has conventionally been employed for manufacturing integrated circuit elements, color filters, liquid crystal display elements, etc. In manufacturing integrated circuits or the like, a positive- or negative-working resist is applied onto a substrate directly or after forming thereon an anti-reflective coating and, after removing a solvent from the coated layer by baking, an anti-reflective coating is optionally formed on the resist film, patternwise exposure is conducted from the coated side using a radiation such as ultraviolet rays, deep ultraviolet rays, electron beams, X-rays, etc., and the exposed coat is subjected to developing procedure to form a resist pattern. The above-described procedure of coating a resist or the like is conducted by employing a known one selected from various known methods such as spin-coating, roller-coating, reverse roller-coating, cast coating, doctor coating, dip coating, etc. In manufacturing, for example, integrated circuit elements, spin coating method is mainly employed as a resist-coating method. In the spin-coating method, a resist-forming solution is dropped onto a substrate, the dropped resist solution is then cast toward the periphery of the substrate by rotation of the substrate, with excess resist-forming solution being scattered out of the periphery of substrate, thus a resist layer with a desired thickness being formed. In this procedure, however, there arises a problem that a part of the resist-forming solution runs to the backside of the substrate, or that the resist-forming solution remains in more thickness at the periphery of the substrate than in the rest of the substrate, which is called bead formation. So, it is necessary to remove unnecessary resist from the periphery or backside of the substrate or to remove the bead. The same applies to manufacture of color filters, liquid crystal display elements, etc. In other coating methods than the spin-coating method, too, a resist can adhere to unnecessary and undesirable portions as with the spin-coating method. In addition, with manufacture of integrated circuits using an anti-reflective coating between the substrate and the resist layer, the anti-reflective coating must be removed after formation of a pattern. On the other hand, the resist-forming solution adheres to the coating apparatus, and it must be washed prior to the next use thereof. A rinsing solution comprising an organic solvent has been considered preferable for removal or delamination of such resist or anti-reflective coating, prevention of bead formation and, further, washing of a coating apparatus, and hence rinsing solutions consisting of an organic solvent alone has been employed (for example, Japanese Examined Patent Publication No. H4-49938). These rinsing solutions are still required to acquire more improved solubilizing or stripping properties for a resist or an anti-reflective coating.

On the other hand, it has been proposed in Japanese Unexamined Patent Publication Nos.H5-188598, H6-69120, H6-148896, etc. to form an anti-reflective coating from an aqueous solution and, in recent years, aqueous solutions have increasingly been used to form anti-reflective coating. It has also been desired to provide a rinsing solution which shows a preferable rinsing effect of shortening the time required for dissolving away the anti-reflective film formed from the aqueous solution and which further satisfies requirement for safety against fire and in handling. Conventional rinsing solutions, however, fail to completely satisfy these requirements.

SUMMARY OF THE INVENTION

It is an object of the present invention to provide a rinsing solution which does not have the above-described defects, which shows good solubilizing or stripping properties for an anti-reflective thin film formed from an aqueous solution as well as for a resist or an anti-reflective thin film formed from an organic solvent solution, and which imposes less danger of causing fire and therefore can be easily handled under the regulations of the Fire Services Act.

Other objects, features and advantages of the present invention will become apparent from the detailed description of the preferred embodiments of the invention to follow.

As a result of intensive investigations, the inventors have found that there can be obtained a rinsing solution by adding water to a water-soluble organic solvent having itself conventionally been used as a solvent or a rinsing liquid for resists or anti-reflective layers, which shows better dissolving or stripping ability on the resists or the anti-reflective layers than a solution consisting essentially of a water-soluble organic solvent alone, which has an increased flashing point due to the co-presence of water and imposes less danger of causing fire and, therefore, which provides improved handling safety under the regulation of the Fire Services Act, thus having achieved the present invention based on the findings. That is, the present invention provides a rinsing solution for lithographic process, which comprises a homogeneous solution of a water-soluble organic solvent and water.

DETAILED DESCRIPTION OF THE PREFERRED EMBODIMENTS OF THE INVENTION

As the water-soluble organic solvent, those water-miscible organic solvent can be used independently or as a mixture of two or more that have been used as solvents or rinsing solutions for resists or anti-reflective coatings. Examples of the water-soluble organic solvent to be used in the present invention include propylene glycol alkyl ethers, propylene glycol alkyl ether acetates, ethyl lactate(EL), methyl ethyl ketone, methyl isobutyl ketone, acetone, etc.

As the above-described propylene glycol alkyl ethers, there are illustrated, for example, propylene glycol monomethyl ether (PGME), propylene glycol monoethyl ether (PGEE), propylene glycol monopropyl ether, etc. and, as the propylene glycol alkyl ether acetates, there are illustrated propylene glycol monomethyl ether acetate (PGMEA), propylene glycol monoethyl ether acetate, propylene glycol monopropyl ether acetate, etc. As the mixture of two or more of them, a mixture of, for example, PGME and PGMEA, or PGEE and PGMEA are preferred.

In the present invention, the aforesaid water-soluble organic solvent is used in combination with water. A preferred content of water in the rinsing solution varies depending upon the solvent to be used in combination, thus not being described in a definite manner. However, as a general guide, water is used in an amount of 0.5 to 200 parts by weight per 100 parts by weight of the water-soluble organic solvent, with 0.5 to 100 parts by weight being preferred. With respect to particular specific examples of the solvents, 25 parts by weight or less amount of water is more preferred for a mixture of PGME and PGMEA (70:30 by weight), 100 parts by weight or less amount of water for a mixture of PGEE and PGMEA (50:50 by weight), and 55 parts by weight or less amount of water for EL. Additionally, with methyl isobutyl ketone, when water content exceeds 2 parts by weight, separation of water and methyl isobutyl ketone from each other tends to take place, thus water being preferably used in an amount of 2 parts by weight or less than that.

The rinsing solution of the present invention may be applied to any of known positive-working resists, negative-working resists and anti-reflective coatings. As typical examples of the resists to which the rinsing solution of the present invention is applicable, there are illustrated positive-working ones such as a resist comprising a quinonediazide photosensitizer and an alkali-soluble resin and a chemically amplified resist and negative-working ones such as a resist containing a photosensitive group-having high molecular compound (e.g., polyvinyl cinnamate), a resist containing an aromatic azide compound or a combination of cyclized rubber and azide compound (e. g. , bisazide compound), a resist containing a diazo resin, a photopolymerizable composition containing an addition-polymerizable unsaturated compound, and a chemically amplified negative-working resist.

The above-described resist material comprising a quinonediazide sensitizer and an alkali-soluble resin is a preferred resist to which the rinsing solution of the present invention is applied. Examples of the quinonediazide sensitizers and alkali-soluble resins used f or the resist materials comprising the quinonediazide sensitizer and the alkali-soluble resin are illustrated below. That is, as the quinonediazide sensitizers, there are illustrated 1,2-benzoquinonediazide-4-sulfonic acid, 1,2-naphthoquinonediazide-4-sulfonic acid, 1,2-naphthoquinonediazide-5-sulfonic acid, esters or amides of these sulfonic acids, etc. and, as the alkali-soluble resins, there are illustrated polyvinyl phenol, polyvinyl alcohol, copolymers of acrylic acid or methacrylic acid, novolak resins manufactured from one or more of phenols such as phenol, o-cresol, m-cresol, p-cresol and xylenol and aldehydes such as formaldehyde, paraformaldehyde, etc.

Chemically amplified resists are also preferred resists to which the rinsing solution of the present invention is applicable. The chemically amplified resists are resists in which, when exposed to radiation, an acid is generated and this acid in turn causes change in solubility of the radiation-exposed portion for a developer due to chemical change by the catalytic action of the acid, leading to creation of a pattern. As the examples thereof, there are illustrated those which comprise an acid-generating compound capable of generating an acid upon being exposed to radiation and a resin having an acid-labile group capable of being decomposed in the presence of an acid to generate an alkali-soluble group such as a phenolic hydroxyl group or a carboxyl group and those which comprise an alkali-soluble resin, a cross-linking agent and an acid-generating agent.

On the other hand, as the anti-reflective coating to which the rinsing solution of the present invention is applicable, any anti-reflective coating that comprises an organic material may be employed. As such anti-reflective coating, there are those which are formed from an organic solvent or an aqueous solution: for example, polyamic acid or polybutenoic acid to which a lye is added (U.S. Pat. No. 4,910,122), copolymers to which a dye is added (e.g.,. Japanese Unexamined Patent Publication No. H6-118656, etc.), graft polymers obtained by grafting a dye or the like to maleic anhydride polymers, itaconic anhydride polymers, polyacrylate or polymethacrylate (U.S. Pat. Nos. 2,751,373, 2,811,509, 3,763,086, 3,854,946, and 4,609,614), a reaction product of a polymer having anhydride groups with an aminoaromatic chromophore (U.S. Pat. No. 5,294,680), a composition comprising a water-soluble polymer and a water-soluble perfluorocarboxylic acid (Japanese Unexamined Patent Publication No. H5-188598), a solution of organic alkali solution such as tetramethylammonium hydroxide containing a water-soluble high polymer (Japanese Unexamined Patent Publication No. H6-69120), a composition comprising a water-soluble film-forming component and a fluorine-containing surfactant (Japanese Unexamined Patent Publication No. H6-148896), a composition comprising a perfluoroalkylcarboxylic acid, an organic amine and polyvinyl pyrrolidone (Japanese Patent Application No. H7-131096), a composition comprising a perfluoroalkylsulfonic acid, an organic amine, polyvinylpyrrolidone, and a water-soluble alkylsiloxane polymer (Japanese Patent Application No. H8-129056), etc. Presence of water in the rinsing solution in accordance with the present invention serves to provide a good affinity for a film formed from an aqueous solution (contact angle being small), and hence good rinsing effect can be obtained for an anti-reflective coating formed from an aqueous solution as well.

Application of the rinsing solution of the present invention will be described below by reference to a process for forming a resist pattern. First, a resist solution is coated on a silicon substrate, a glass substrate, etc. having optionally been pre-treated, according to a conventionally known coating method such as a spin coating method. An anti-reflective coating is optionally formed before or after coating of a resist on a substrate. In spin coating method, for example, bead of the resist or the anti-reflective coating tends to be formed along the periphery of the substrate. However, a resist layer or an anti-reflective coating having a substantially uniform thickness can be formed by spraying the rinsing solution of the present invention on the bead formed along the periphery under rotation to thereby increase fluidity of the bead. In addition, a resist composition or an anti-reflective coating solution adhering onto the side of the substrate or running to the backside thereof can be removed by spraying thereon the rinsing solution. In the case where a positive-working resist is used and an anti-reflective coating is intervened between a substrate and the photoresist layer, the anti-reflective coating at portions not covered by the patterned resist formed by exposure and subsequent development may be removed in a wet manner by using this rinsing solution.

The resist coated on a substrate is prebaked, for example, on a hot plate to remove the solvent, thus a resist layer of usually about 1 to 2.5 microns in thickness being formed. Prebaking temperature varies depending upon the kind of solvent or resist used but, usually, prebaking is conducted at about 20 to about 200° C., preferably about 50 to about 150° C. The thus prebaked resist is then subjected to patternwise exposure, optionally through a mask, using a known irradiating apparatus such as a high pressure mercury lamp, a metal halide lamp, a super-high pressure mercury lamp, a KrF excimer laser, a soft X-ray irradiating apparatus or an electron beam inscribing apparatus. After the patternwise exposure, after-baking is optionally conducted in order to improve developability, resolution, shape of pattern, etc. Then, development procedure is conducted to form a patterned resist. Development of the resist is ordinarily conducted by using a developer utilizing the difference in solubility of exposed areas and non-exposed areas for a solvent or an alkali solution. As an alkaline developing solution, there may be used, for example, an aqueous solution or a water-containing solution of sodium hydroxide, tetramethylammonium hydroxide(TMAH) or the like.

A coating apparatus, used for coating the above-described resist or the anti-reflective coating on the substrate, may be reused for coating a different coating composition; for example, for coating an anti-reflective coating composition after coating a resist composition, coating another resist composition after coating one resist composition, or coating a resist composition after coating an anti-reflective coating composition. In such cases, the coating apparatus is to be washed prior to its use for coating different coating composition, and the rinsing solution of the present invention can effectively be utilized in such cases as well.

The present invention is now described in more detail by reference to Examples and Comparative Examples which, however, are not construed to be limited at all.

EXAMPLE 1

The following quinonediazide sensitizer and novolak resin were used in such amounts that 24 parts by weight of quinonediazide sensitizer was used per 100 parts by weight of novolak resin, and the resulting mixture was dissolved in a solvent of propylene glycol monomethyl ether acetate (PGMEA) to prepare a solution containing 25 wt % of these solid components, thus a resist composition being prepared.

Quinonediazide sensitizer: esterification product between 2,3,4,4'-tetrahydroxybenzophenone and 1,2-naphtoquinonediazido-5-sulfonyl chloride Novolak resin: polycondensation product between a mixture of m-cresol and p-cresol (6/4) and formaldehyde The thus-prepared resist composition was spin-coated on a 4-inch silicon substrate in a thickness of 2.6 μm after being prebaked, then prebaked on a direct hot plate at 100° C. for 90 seconds to form a resist layer. Additionally, in this Example, thickness of the resist layer is greater than is usually employed for the purpose of conducting solubility test.

The thus-formed resist layer was subjected to solubility test using rinsing solutions 1-(1) to 1-(9) shown in Table 1 consisting of a mixed solvent (solvent A) of propylene glycol monoethyl ether (PGEE) and propylene glycol monomethyl ether acetate (PGMEA) (5:5) and water according to the solubility test described below to obtain the results tabulated in Table 1. (Solubility test)

0.03 ml of each rinsing solution was dropped on the resist layer, and a time (in second) necessary for the underlying silicon surface to be bared was measured. Thickness of the resist layer (Å) was divided by the time to determine solubility speed. (Å/sec).

COMPARATIVE EXAMPLE 1

The same procedures as in Example 1 were conducted except for using a water-free rinsing solution consisting of solvent A alone as the rinsing solution to obtain the results shown in Table 1.

TABLE 1

| No. of Rinsing Solution | Formulation of Rinsing Solution | | Dissolving Speed (Å/sec) |
|---|---|---|---|
| | Solvent A (parts by weight) | Water (parts by weight) | |
| 1-(1) | 100 | 2.5 | 7400 |
| 1-(2) | 100 | 5 | 8800 |
| 1-(3) | 100 | 3.5 | 9500 |
| 1-(4) | 100 | 10 | 10000 |
| 1-(5) | 100 | 15 | 10100 |
| 1-(6) | 100 | 20 | 9800 |
| 1-(7) | 100 | 30 | 9400 |
| 1-(8) | 100 | 50 | 8100 |
| 1-(9) | 100 | 100 | 6800 |
| Comparative Example 1 | 100 | 0 | 5300 |

As is apparent from the results shown in Table 1, it is seen that dissolving speed is remarkably increased by incorporating water in the mixed solvent composed of PGEE and PGMEA.

EXAMPLE 2

The same procedures as described in Example 1 were repeated except for using a mixed solvent (solvent B) of propylene glycol monomethyl ether (PGME) and PGMEA (7:3) in place of the solvent A to obtain the results shown in Table 2.

COMPARATIVE EXAMPLE 2

The same procedures as described in Example 1 were conducted except for using as rinsing solution solvent B alone not mixed with water to obtain the results shown in Table 2.

TABLE 2

| No. of Rinsing Solution | Formulation of Rinsing Solution | | Dissolving Speed (Å/sec) |
|---|---|---|---|
| | Solvent B (parts by weight) | Water parts by weight) | |
| 2-(1) | 100 | 5 | 13100 |
| 2-(2) | 100 | 10 | 13600 |
| 2-(3) | 100 | 15 | 13000 |
| 2-(4) | 100 | 20 | 12000 |
| Comparative Example 2 | 100 | 0 | 11200 |

As is apparent from the results shown in Table 2, dissolving speed is increased as in Example 1 by incorporating water in the mixed solvent of PGME and PGMEA.

EXAMPLE 3

The same procedures as in Example 1 were repeated except for using ethyl lactate (EL) in place of solvent A and employing the mixing ratios shown in Table 3 to obtain the results shown in Table 3.

COMPARATIVE EXAMPLE 3

The same procedures as in Example 1 were conducted except for using EL alone as a rinsing solution to obtain the results shown in Table 3

TABLE 3

| No. of Rinsing Solution | Formulation of Rinsing Solution | | Dissolving Speed (Å/sec) |
|---|---|---|---|
| | EL (parts by weight) | Water (parts by weight) | |
| 3-(1) | 100 | 10 | 6100 |
| 3-(2) | 100 | 20 | 5800 |
| 3-(3) | 100 | 40 | 3900 |
| Comparative Example 3 | 100 | 0 | 2800 |

As is apparent from the results shown in Table 3, dissolving speed is increased by incorporating water in EL.

EXAMPLE 4

A composition for forming anti-reflective coating consisting of 1 part by weight of polyvinylpyrrolidone, 4 parts by weight of perfluorooctanesulfonic acid, 0.35 part by weight of 2-aminoethanol, 0.004 part by weight of a water-soluble alkylsiloxane polymer (Polyflow-KL-245, manufactured by Kyoueisha Yusi) and 94.646 parts by weight of pure water was spin coated on a 4-inch silicon substrate, baked at 90° C. for 90 seconds to form a 650 Å anti-reflective coating. Each of the rinsing solutions in Examples 1 to 3 was dropped on the surface of this anti-reflective coating. All of the rinsing solutions showed small contact angles with the anti-reflective coating immediately after being dropped thereon, and the rinsing solutions showed such a good affinity for the anti-reflective coating that smooth dissolution was attained in comparison with water-free rinsing solutions.

As has been described hereinbefore, the rinsing solution of the present invention prepared by adding water to a water-soluble organic solvent has the advantage that, in comparison with the conventional rinsing solutions consisting of water-soluble organic solvents alone, there can be obtained more increased dissolving ability for resist layers, anti-reflective coatings, etc. and that the rinsing solution has such a good affinity for a layer formed from an aqueous solution that smooth dissolution of the layer can be attained.

In addition, presence of water in the rinsing solution serves to increase the flashing point of the rinsing solution, which permits easier handling under regulations of the Fire Services Acts and in its production site or factories where it is used.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims.

What is claimed is:

1. A process for dissolving or stripping away a resist layer or an antireflective coating that comprises the steps of:

providing a homogeneous solution of a water-soluble organic solvent consisting essentially of at least one water-soluble solvent selected from the group of: propylene glycol alkyl ethers, propylene glycol alkyl ether acetates, ethyl lactate, methyl ethyl ketone, methyl isobutyl ketone and acetone and water, water is used in an amount of 0.5 to 200 parts by weight per 100 part by weight of the water-soluble organic solvent, providing a resist layer or antireflective coating; and rinsing said resist layer or antireflective coating with said homogeneous solution of a water-soluble organic solvent.

2. The process for dissolving or stripping away a resist layer or an antireflective coating as described in claim 1, wherein said water-soluble organic solvent is a mixture of propylene glycol alkyl ether and propylene glycol alkyl ether acetate.

3. The process for dissolving or stripping away a resist layer or an antireflective coating as described in claim 2, wherein said propylene glycol alkyl ether is propylene glycol monomethyl ether and said propylene glycol alkyl ether acetate is propylene glycol monomethyl ether acetate.

4. The process for dissolving or stripping away a resist layer or an antireflective coating described in claim 2, wherein said propylene glycol alkyl ether is propylene glycol monoethyl ether and said propylene glycol alkyl ether acetate is propylene glycol monomethyl ether acetate.

5. The process for dissolving or stripping away a resist layer or an antireflective coating as described in claim 1, wherein said water-soluble organic solvent is ethyl lactate.

* * * * *